(12) United States Patent
Nakasuji (10) Patent No.: US 6,300,023 B1
(45) Date of Patent: Oct. 9, 2001

(54) MICROLITHOGRAPHIC PATTERN-TRANSFER METHODS FOR LARGE SEGMENTED RETICLES, AND DEVICE MANUFACTURING METHODS USING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/346,259

(22) Filed: Jul. 1, 1999

(30) Foreign Application Priority Data

Jul. 28, 1998 (JP) ................................. 10-226586

(51) Int. Cl.⁷ ................................ G03F 9/00; G03C 5/00
(52) U.S. Cl. .............................. 430/30; 430/17; 430/296; 430/311; 430/942
(58) Field of Search ............................. 430/30, 17, 296, 430/311, 942

(56) References Cited

U.S. PATENT DOCUMENTS 5,689,117  11/1997  Nakasuji ..................... 250/492.23
6,117,598 * 9/2000  Imai ................................ 430/296
6,117,600 * 9/2000  Nakasuji ............................ 430/30

FOREIGN PATENT DOCUMENTS 8-69965   3/1996  (JP) .

* cited by examiner

Primary Examiner—Christopher G. Young
(74) Attorney, Agent, or Firm—Klarquist Sparkman LLP (57) ABSTRACT

Microlithographic pattern transfer-exposure methods are disclosed by which a pattern for a semiconductor device or the like on the scale of a 16-gigabit DRAM on a 12-inch-diameter substrate can be formed, including such patterns comprising complementary features. The reticle is mounted on a moveable reticle stage and the substrate is mounted on a moveable substrate stage. The reticle pattern is segmented into pattern portions that are transferred onto individual corresponding regions on the substrate. The reticle stage and/or substrate stage can be moved in a step-and-repeat manner and in a continuous-scanning manner during pattern transfer.

19 Claims, 5 Drawing Sheets

FIG. 5

MICROLITHOGRAPHIC PATTERN-TRANSFER METHODS FOR LARGE SEGMENTED RETICLES, AND DEVICE MANUFACTURING METHODS USING SAME

FIELD OF THE INVENTION

This invention relates to microlithography apparatus and methods that employ an energy beam (light or charged particles) and a pattern-transfer optical system to transfer a pattern, defined by a reticle, onto a sensitized substrate. Such apparatus and methods are used, e.g., in the manufacture of integrated circuits, displays, and the like.

More specifically, the invention relates to, inter alia, methods for transferring a large pattern that exceeds the field dimensions of the pattern-transfer optical system, while achieving high throughput and high resolution of ultra-fine pattern features on the substrate.

Much of the following discussion is in the context of using a charged particle beam (specifically an electron beam) as the energy beam. However, it will be understood that the energy beam can be any of various other charged particle beams, such as an ion beam, or any of various beams of electromagnetic radiation, such as visible light, ultraviolet light, or X-rays.

BACKGROUND OF THE INVENTION

Current trends in which patterns for integrated circuits and displays are being made increasingly larger have resulted in the reticle pattern frequently being larger than the field of the exposure-optical system of the microlithography apparatus. This situation especially arises in charged-particle-beam (CPB) microlithography apparatus in which the field of the exposure-optical system typically is very small compared to the area of the reticle. In situations in which the pattern is larger than the optical field, the pattern is usually divided into multiple individual exposure units (e.g., "subfields") that are separately exposed in an ordered manner to transfer the entire pattern. Microlithography performed using such a reticle is termed "divided" transfer-exposure.

During transfer of individual exposure units in divided transferexposure, the reticle and substrate (which are mounted on respective movable stages) are moved in a coordinated manner as required in respective planes that are perpendicular to the optical axis of the exposure-optical system. Also, as each exposure unit is exposed, one or more of certain parameters of the exposure-optical system (e.g., focus, image magnification, aberration correction, etc.) are optimized for the respective exposure field. The coordinated movements of the reticle stage and substrate stage can be according to either a "step-and-repeat" or a "continuous scanning" scheme. In step-and-repeat exposure, the stages move intermittently (e.g., to position the next exposure unit for exposure) and no exposures are made while the stages are moving. Rather, an exposure is made (of the positioned exposure unit) only when the stages are stationary. In continuous scanning exposure, exposures are made while the stages are moving at respective scanning velocities.

In CPB microlithography, the reticle can be a so-called "stencil" reticle or a so-called "membrane" reticle. With a stencil reticle, pattern features (i.e., pattern elements) are defined as respective through-apertures in a reticle plate. Certain features, such as "island" features, cannot be completely defined using a single respective aperture in a stencil reticle. Such features are usually divided into two complementary features defined in separate exposure units that are transferred onto the substrate in separate respective exposures ("shots").

As is generally known, a current quest in integrated circuit technology is the manufacture of ever-larger memory chips. According to contemporary "roadmaps" of memory circuits, the anticipated dimensions of a 16-gigabit DRAM chip are approximately 40×20 mm. As explained in more detail below, the dimensions of a reticle (assuming a demagnification factor of ¼ and no complementary exposure units required) for such a chip would exceed 200×100 mm. If the pattern required any complementary exposure units, then the reticle would be even larger, and likely would not fit on a 12-inch diameter reticle plate.

SUMMARY OF THE INVENTION

In view of the problems of the prior art, as summarized above, the present invention provides, inter alia, transfer-exposure methods in which a complete reticle pattern (including complementary features) can be defined on a single reticle substrate such as a 12-inch diameter silicon wafer. Such a reticle can be used to transfer-expose the pattern onto a suitable substrate at acceptable throughput and transfer accuracy.

To such end, according to a first aspect of the invention, methods are provided for transferring a pattern, defined by multiple pattern portions on a segmented reticle, onto a substrate using an energy beam (e.g., light beam or charged particle beam). The reticle is mounted on a movable reticle stage and the substrate is mounted on a movable substrate stage. According to a representative embodiment of the method, during transfer-exposure of the pattern portions from the reticle to the substrate, the reticle stage and the substrate stage are moved at respective movement velocities with which the ratio of the movement velocities changes during the transfer-exposure. Thus, the pattern is transferred at velocities that can be varied to fit the characteristics of the various features or portions of the pattern being transferred, yielding higher throughput and transfer accuracy than obtainable with conventional methods.

According to second representative embodiment, a method is provided for transferring a pattern, defined by a segmented reticle, onto a substrate using an energy beam and a projection-optical system. The reticle is mounted on a movable reticle stage and the substrate is mounted on a movable substrate stage. The pattern is divided into multiple pattern portions individually definable on the reticle. The pattern portions are categorized as individually being of a first group or of a second group. The first group consists of pattern portions requiring division into primary and secondary pattern portions wherein each secondary pattern portion is complementary to a corresponding primary pattern portion. The second group consists of pattern portions not requiring division into primary and secondary pattern portions. On the reticle, a first region is formed containing the pattern portions of the second group and the primary pattern portions of the first group; a second region is also formed containing the secondary pattern portions of the first group. The pattern portions in the first region are transferred while moving the reticle stage at a velocity ratio of $(M+\alpha):1$ relative to the movement velocity of the substrate stage, wherein $1/M$ is the demagnification ratio of the projection-optical system and $\alpha$ is a positive rational number denoting the proportion of the reticle occupied by non-patterned areas. The pattern portions in the second region are transferred while either moving the substrate stage at a velocity greater than the velocity used during transfer of the pattern portions in the first region or moving the reticle stage in a step-and-repeat manner. The pattern portions are desirably "scanning strips," as defined herein, wherein the first region is a "primary stripe" containing multiple scanning strips, and the second region is a "secondary stripe" containing at least one scanning strip.

According to yet another representative embodiment, a method is provided for transferring a pattern, defined by a segmented reticle, onto a substrate using an energy beam and a projection-optical system. The reticle is mounted on a movable reticle stage and the substrate is mounted on a movable substrate stage. The pattern is divided into multiple stripes and scanning strips, wherein a scanning strip is a portion of a stripe. For each scanning strip, if a particular scanning strip contains one or more pattern features requiring splitting into primary features and corresponding secondary features, then the respective scanning strip is split into a primary scanning strip and a secondary scanning strip. The primary scanning strip contains the primary features and the secondary scanning strip contains the secondary features. For each scanning strip, if a particular scanning strip contains only primary features, then that scanning strip is regarded as a primary scanning strip. The primary scanning strips are grouped into primary stripes and the secondary scanning strips are grouped into secondary stripes. The scanning strips in the primary stripes are transferred while moving the reticle stage at a velocity ratio of $(M+\alpha):1$ relative to the movement velocity of the substrate stage, wherein $1/M$ is the demagnification ratio of the projection-optical system and $\alpha$ is a positive rational number denoting the proportion of the reticle occupied by non-patterned areas. The scanning strips in the secondary stripes are transferred while either moving the substrate stage at a velocity greater than the velocity used to transfer the scanning strips in the primary stripes or moving the reticle stage in a step-and-repeat manner.

According to yet another representative embodiment, a method is provided by which a pattern, defined by a segmented reticle, is transferred onto a substrate using an energy beam and a projection-optical system. The reticle is mounted on a movable reticle stage and the substrate is mounted on a movable substrate stage. The features of the pattern are categorized into "large" features and "small" features (as defined herein). The large features are grouped into primary stripes and the small features are grouped into secondary stripes. The features in the primary stripes are transferred while moving the reticle stage at a velocity ratio of $(M+\alpha):1$ relative to the movement velocity of the substrate stage, wherein $1/M$ and $\alpha$ are defined above. The features in the scanning strips in the secondary stripes are transferred while either moving the substrate stage at a velocity less than the velocity used to transfer the features in the primary stripes or moving the reticle stage in a step-and-repeat manner. The features in each of the primary stripes and the secondary stripes can be grouped into exposure units, wherein each stripe contains multiple exposure units. Each exposure unit can be exposed, for example, in a scanning manner or in a step-and-repeat manner. The large features generally are transferred with a smaller dose than the small features to compensate for resist-heating effects.

Conventional optical microlithography methods achieve a throughput (number of wafers that can be exposed per unit time) of about 80 12-inch-diameter wafers per hour. Conventional electron-beam methods achieve a throughput for 12-inch-diameter wafers of about 20 wafers per hour. Consequently, conventional electron-beam transfer-exposure is less likely to be used for the microlithography of certain layers of a semiconductor device. Rather, conventional electron-beam methods are more likely to be used for forming contact-hole layers and gate layers because such patterns typically lack features that need to be split into complementary features. Other patterns, such as for memory chips, include peripheral circuits having features that may require splitting into complementary features. With such chips, relatively few features are split into complementary features. Such features can be adequately accommodated in pattern portions located in perimeter regions of the reticle. Thus, pattern portions including features that are not split (and features representing one of a complementary pair of split features) can be situated in the central regions of the reticle because such pattern portions represent most of the reticle pattern. The pattern portions including the other of each complementary pair of split features can be situated in peripheral regions of the reticle. Such a configuration provides a reticle with a highly efficient use of reticle space, making it more likely that all the pattern features can be accommodated on a single reticle substrate.

In any of the transfer-exposure methods summarized above, it is not necessary that the complementary features be neatly and regularly packed on the reticle. But, the complementary features still need to be transferred in an ordered manner. Since such features typically occupy a relatively small area on the reticle, they can be densely formed on the reticle. If such features are transferred by continuously moving the reticle stage and substrate stage, it can be difficult to coordinate the movements of the reticle stage and substrate stage. In such instances, it may be more advantageous to perform transfer-exposure by moving the stages in a step-and-repeat manner. Alternatively, it may be desirable to move the substrate stage in a continuous manner while moving the reticle in a step-and-repeat manner.

The foregoing and additional features and advantages of the invention will be more readily understood from the following detailed description, which proceeds with reference to the accompanying drawings.

DETAILED DESCRIPTION

Figure 3:
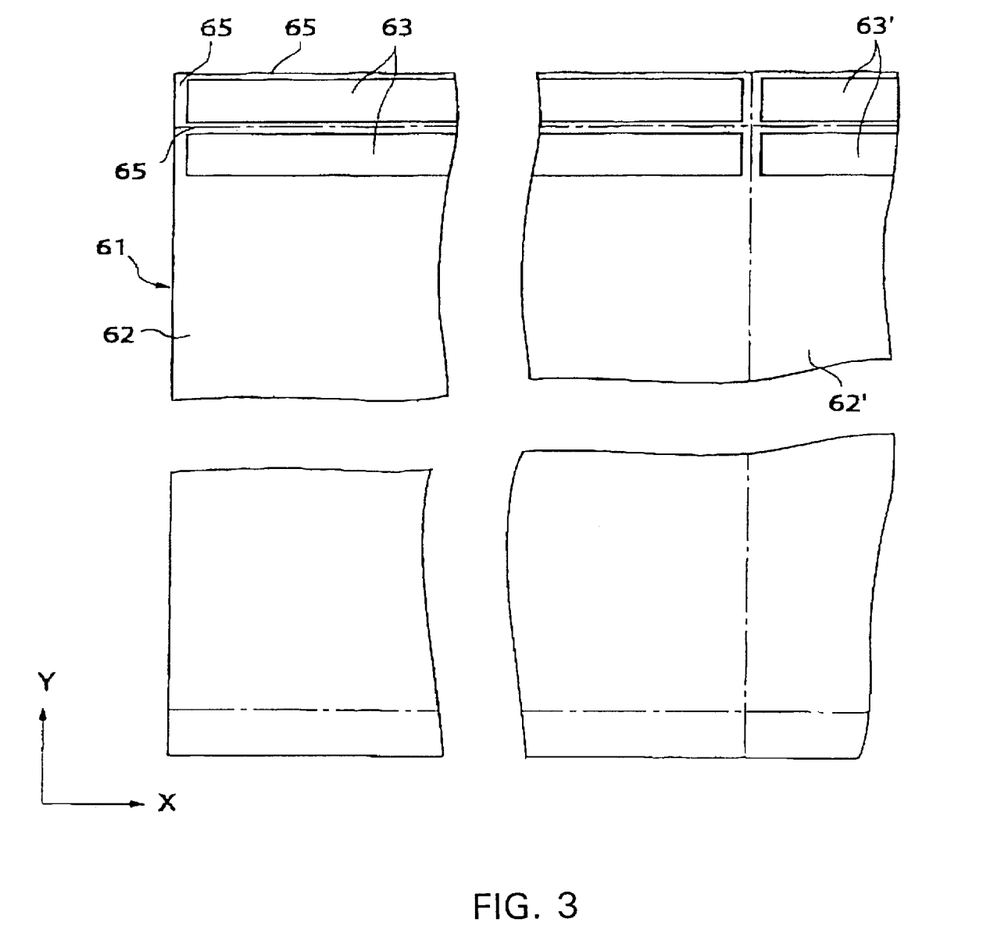
FIG. 3 is a plan view of a representative manner in which a pattern can be divided on a reticle to be used for divided transfer-exposure using a charged particle beam.

A representative manner in which a pattern can be divided on a reticle is shown in FIG. 3. The FIG. 3 reticle is especially suitable for divided transfer-exposure using an electron beam (as a representative energy beam). In FIG. 3, the X direction extends horizontally left to right and the Y direction extends vertically. In this example, an overall chip pattern 61 on the reticle is rectangular. The chip pattern 61 is divided into multiple "stripes" 62 extending in the Y direction. Each stripe 62 is divided into multiple scanning strips 63 that extend in the X direction. By way of example, a typical scanning strip 63 on the reticle has a width (extending in the Y direction) slightly greater than 1 mm and a length (extending in the X direction) of 20 to 40 mm.

The FIG. 3 reticle can be either a stencil reticle or a membrane reticle. In a stencil reticle, pattern features are defined by apertures (through-holes) extending through the thickness dimension of a silicon "reticle plate." The apertures typically are formed by etching a silicon wafer, wherein the wafer serves as the reticle plate. In a membrane reticle, pattern features are defined by spaces between regions of a highly scattering layer or highly absorbing layer applied to a silicon membrane.

In FIG. 3, several tens to several hundred scanning strips 63 are arranged in each of one or more columns in the Y direction. Each column of scanning strips 63 constitutes a respective stripe 62. Typically, three to seven stripes 62 are arranged in the X direction.

Each scanning strip 63 is flanked by a non-patterned boundary zone 65 each measuring approximately 0.1 to 0.3 mm wide. Along the midline of each boundary zone 65, the thickness is substantially greater than, e.g., inside a scanning strip 63 (e.g., a thickness along the midline of 1 mm compared to a thickness within a scanning strip of 2.0 μm). Such thickened regions serve as reinforcing struts that provide the reticle with rigidity. Within each boundary zone 65, the respective strut can be flanked by "skirts." A skirt is a portion of the boundary zone that is not thickened to form a strut.

During transfer-exposure of the reticle pattern, the boundary regions 65 are not exposed or otherwise transferred to the substrate. Hence, exposure is performed in a manner by which the scanning strips 63 and stripes 62 are "stitched" together on the substrate to form the overall chip pattern.

A 4-gigabit DRAM as imprinted on the substrate measures about 27 mm in the X direction and 44 mm in the Y direction. Assuming a demagnification factor of ¼ or ⅕ (wherein the pattern on the reticle is 4× or 5× larger, respectively, than the corresponding image as formed on the substrate), the overall size of the chip pattern on the reticle, including the boundary zones 65, is approximately 120 to 150 mm in the X direction and 150 to 250 mm in the Y direction.

In a typical transfer-exposure apparatus, an "illumination beam" is an energy beam produced by a source. The illumination beam passes through an "illumination-optical system"(including a beam-shaping aperture) to the reticle. Portions of the illumination beam passing through the reticle, now termed an "imaging beam" or "patterned beam," pass through a "projection-optical system" to the substrate. The illumination-optical system and the projection-optical system collectively comprise the "exposure-optical system" of the transfer-exposure apparatus.

As the chip pattern 61 in FIG. 3 is being transferred, the illumination beam (specifically, an image of the beam-shaping aperture) is moved inside each scanning strip 63 while being deflected in the X direction, thereby progressively illuminating the reticle. The illumination beam typically has a rectangular transverse profile that is slightly wider than the scanning strip 63. The portion ("field") of the scanning strip 63 that is being illuminated by the illumination beam at any one moment is termed an "exposure unit" on the reticle. The patterned beam that has passed through the reticle is "reduced" (demagnified) and directed by the projection-optical system to a location on the substrate onto which an image of the respective exposure unit is to be formed.

Certain reticles can include non-patterned boundary zones, within individual scanning strips 63, separating the exposure units from one another in the respective scanning strip. The illumination beam exposes the exposure units, arranged at a certain pitch in the respective scanning strip, individually in a "step-and-repeat" manner. Any required corrections, such as dynamic focus adjustment, etc., can be performed during the scanning of a scanning strip so as to realize low-aberration projection and imaging.

After completing exposure of a scanning strip 63 and while proceeding to the next scanning strip, the reticle stage and the substrate stage move in the Y direction in synchrony with each other. Because the image on the reticle is typically inverted by the projection-optical system, the stages move in opposite directions. Movements of the stages at this time are continuous. As one scanning strip 63 is being exposed, the scanning strip 63 on the reticle is moved in the Y direction while the substrate is moved in an opposite Y direction. Meanwhile, the illumination beam and patterned beam are deflected as required relative to the stage movements in the Y direction so that the beam strikes the correct locations on the reticle and substrate.

When exposure of a stripe 62 is completed and exposure progresses to the next stripe 62', exposure is temporarily stopped. The reticle stage and the substrate stage are moved in the X direction to position the next stripe 62' on the reticle and the corresponding region on the substrate in the vicinity of the optical axis of the exposure-optical system.

Figure 4:
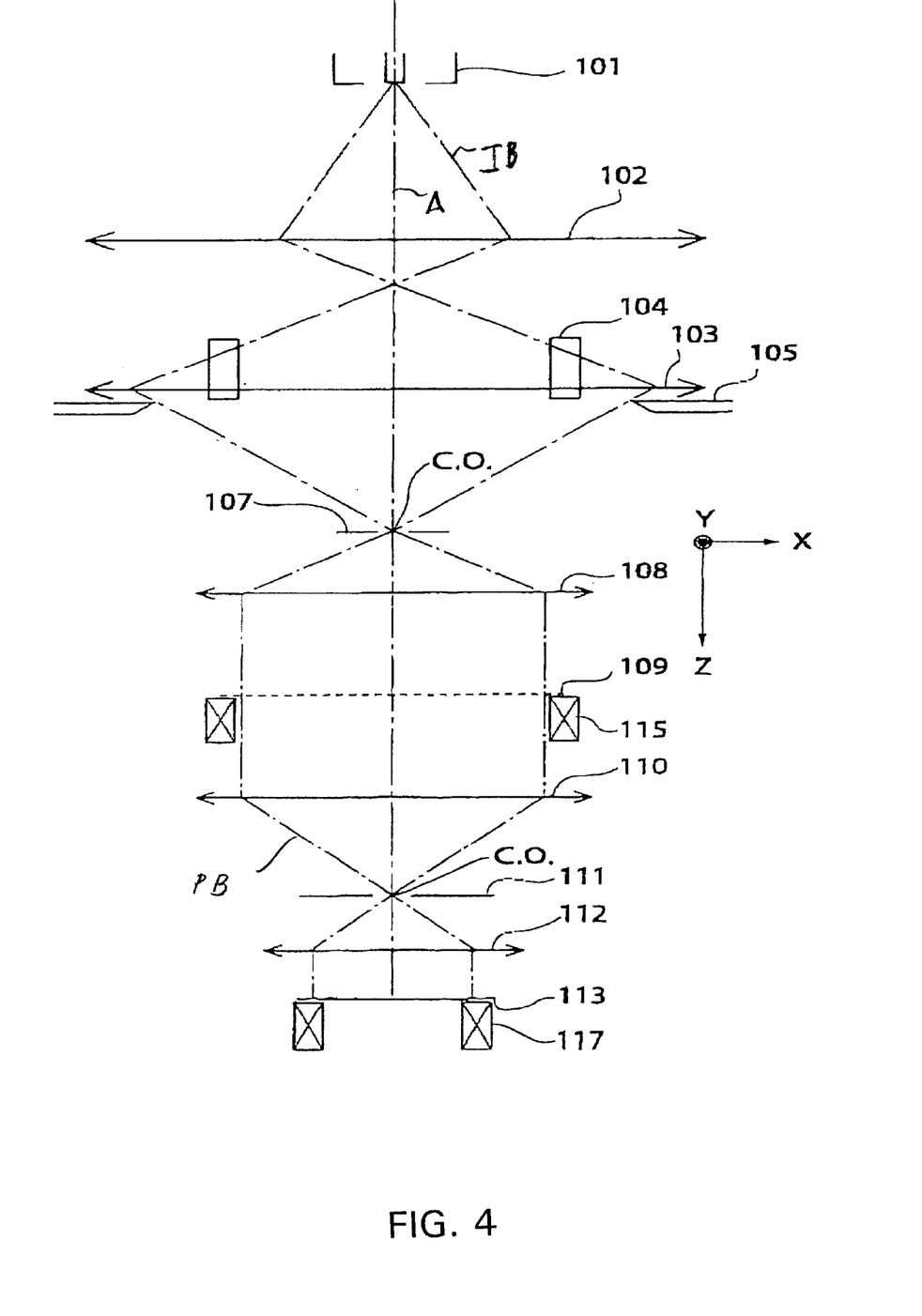
FIG. 4 is a vertical schematic depiction of an exposure-optical system and certain imaging relationships of an electron-beam "reducing" (demagnifying) transfer-exposure apparatus with which methods according to the invention can be used.

FIG. 4 shows certain imaging relationships in the exposure-optical system of a transfer-exposure apparatus useful for practicing a method according to the present invention. The FIG. 4 apparatus utilizes an electron beam as a representative charged particle beam. However, the relationships depicted in FIG. 4 are equally applicable to any of various other charged particle beams as well as any of various energy beams of electromagnetic radiation.

An electron gun 101 is positioned at the most upstream end of the exposure-optical system. The electron gun 101 emits an electron beam (illumination beam IB) that propagates in a downstream direction along an optical axis A. A two-stage condenser lens 102, 103 is situated downstream of the electron gun 101. The illumination beam EB passes through the condenser lenses 102, 103 and forms a crossover image C.O. at a blanking aperture 107. A blanking deflector 104 is situated immediately upstream of the condenser lens 103. The blanking deflector 104 shifts the electron beam EB as required to a position at which the crossover C.O. is blocked by the blanking aperture 107 whenever illumination of the reticle 109 by an illumination beam is not desired. (If the illumination beam IB is a beam of electromagnetic radiation, any suitable component, such as a mirror, analogous to a deflector can be used in place of the blanking deflector 104.) The two condenser lenses 102, 103 collectively operate as a "zoom" lens with which the current density (i.e., intensity distribution) of the illumination beam irradiating the reticle can be varied.

A beam-shaping aperture 105 is situated downstream of the condenser lens 103. The beam-shaping aperture 105 is used for adjusting the transverse profile of the illumination beam. An image of the beam-shaping aperture 105 is formed on the reticle 109 by an irradiation lens 108.

A scanning deflector (i.e., an X-direction deflector, not shown in the figure) is situated downstream of the beam-shaping aperture 105 at approximately the same "height" (axial position) as the blanking aperture 107. The scanning deflector sequentially scans the illumination beam in the X direction in FIG. 4 (i.e., the left-to-right direction in the plane of the page) to expose a scanning strip on the reticle 109. (If the illumination beam IB is a beam of electromagnetic radiation, any suitable component, such as a mirror, analogous to a deflector can be used in place of the scanning deflector.)

An irradiation lens 108 is situated downstream of the blanking aperture 107. The irradiation lens 108 collimates the illumination beam IB for impingement on the reticle 109 on which the illumination beam forms an image of the beam-shaping aperture 105. The FIG. 4 apparatus produces a "reduced" (demagnified) image of the beam-shaping aperture 105 on the reticle 109. The reduced image, compared to an image that is not reduced, causes less heating of the beam-shaping aperture 105 by the illumination beam IB.

Although FIG. 4 shows only the exposure unit of the reticle that is located on the optical axis A, it will be understood that the reticle 109 extends in the X and Y directions perpendicular to the optical axis A. It also will be understood that the reticle 109 has a multiplicity of scanning strips and stripes, as described with respect to FIG. 3. To progressively illuminate a scanning strip, the scanning deflector deflects the illumination beam, as described above.

The reticle 109 is mounted on a reticle stage 115 that is movable in the X and Y directions. Situated downstream of the reticle 109 is a substrate 113 having an upstream-facing surface that is coated with a suitable resist or other substance that is imprintable with an image carried by the pattern beam PB. The substrate 113 is mounted on a substrate stage 117 that can move in the X and Y directions. Each scanning strip 63 of a stripe 62 of the chip pattern in FIG. 3 is exposed by moving the reticle stage 115 and the substrate stage 117 in opposite directions along the Y-axis. Exposure of the various stripes 62 is accomplished by intermittently moving the two stages 115 and 117 in the X direction.

Each stage 115, 117 includes an accurate position-measurement system each employing one or more laser interferometers. Thus, the stages 115, 117 are accurately positioned as required to ensure that the images of the various scanning strips are accurately stitched together on the substrate.

The projection-optical system comprises a two-stage projection lens (objective lens) 110, 112 and deflectors (not shown), all situated downstream of the reticle 109. The illumination beam, as it passes through the illuminated region of the reticle 109, becomes the "patterned beam" PB. As the patterned beam PB passes through the projection-optical system, the patterned beam PB is demagnified and deflected as required to form an image of the illuminated region of the reticle at a desired location on the substrate 113. The resist on the substrate renders the substrate "sensitive" by which is meant that the substrate, upon receiving a dose of the patterned beam PB, is imprinted with an image of the illuminated region of the reticle. Thus, an image of the reticle is "transferred" to the substrate 113.

The substrate 113, as explained above, is mounted on a substrate stage 117 that is movable in directions perpendicular to the optical axis. A crossover C.O. is formed at a point on the optical axis A where the axial distance between the reticle 119 and the wafer 113 is subdivided according to the demagnification ratio. A contrast aperture 111 is disposed at this crossover position. The contrast aperture 111 blocks portions of the patterned beam PB that have been scattered by the reticle, thereby preventing the scattered portions of the beam from reaching the substrate 113.

Figure 1:
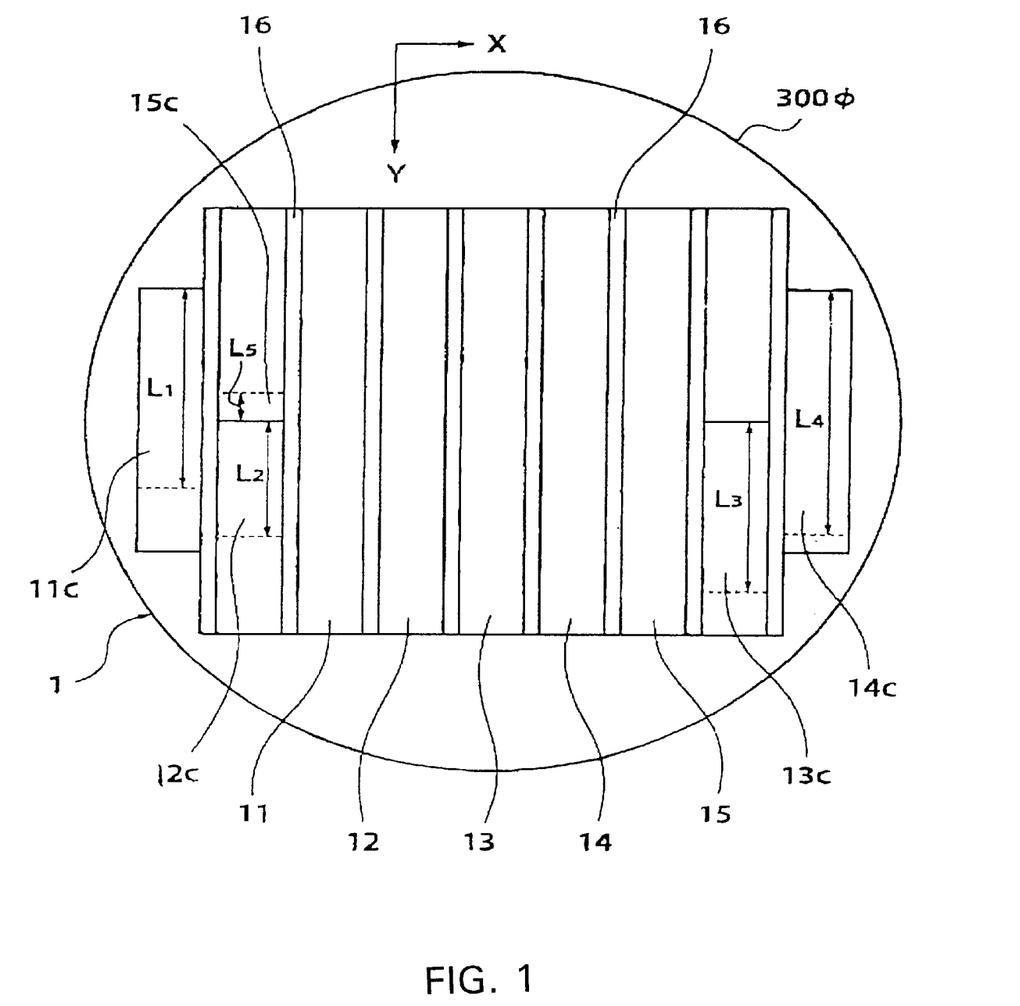
FIG. 1 is a plan view of a pattern as arrayed on a reticle for use in a pattern-transfer method according to a first example embodiment of the invention.

A first example embodiment of a reticle usable with methods according to the invention is shown in FIG. 1. The reticle is arrayed on a circular silicon wafer 1 having a diameter of 12 inches (300 mm). The reticle pattern shown in FIG. 1 is suitable for defining an entire layer of a 16-gigabit DRAM as a representative chip pattern. The pattern comprises five longitudinal "primary stripes" 11–15 situated at the center of the wafer 1. The primary stripes 11–15 are longitudinally separated from each other by boundary zones 16. The boundary zones 16 include respective longitudinal struts (not shown) that are thicker than other regions of the wafer 1. For example, the struts are 1 mm thick in the Z direction and serve as struts (reinforcing members) for the reticle. The primary pattern features of most of the chip pattern are defined in the primary stripes 11–15. Features that cannot be completely formed on a substrate by corresponding primary features on the reticle have first portions that are defined in respective primary stripes 11–15 and complementary second portions that are defined in peripheral "secondary stripes" 11c–15c. That is, certain exposure units in one or more of the primary stripes 11–15 require corresponding complementary exposure units to completely define all the features in the respective exposure units. The complementary exposure units are defined in the secondary stripes 11c–15c. Whereas each primary stripe 11–15 is desirably the same length, each secondary stripe 11c–15c is not necessarily the same length. The depicted length $L_1$–$L_5$ of each respective secondary stripe 11c–15c indicates the respective stripe length required for accommodating the particular number of complementary exposure units in the secondary stripe.

Each primary stripe 11–15 is further subdivided into scanning strips in the manner shown in FIG. 3 and discussed above. For splitting of the pattern into primary and complementary portions, the scanning strip is the splitting unit. In other words, the reticle pattern is divided into stripes and each stripe is divided into scanning strips. If a particular scanning strip has no feature that requires complementary splitting, then that scanning strip is located entirely in a respective primary stripe on the reticle. On the other hand, if a particular scanning strip contains even a single feature that requires complementary splitting, then the entire scanning strip is split into a primary scanning strip (located in a respective primary stripe 11–15) and a secondary scanning strip (located in a respective secondary stripe 11c–15c). In each primary stripe 11–15 and each secondary stripe 11c–15c, the scanning strips extend in the X direction and are arrayed in the Y direction. Each scanning strip includes multiple exposure units. Each scanning strip is separated from adjacent scanning strips by boundary zones each having an associated strut and/or skirts as required.

A layer pattern for a 16-gigabit DRAM (measuring approximately 25 mm×40 mm on the substrate) can be divided into five primary stripes (each measuring 5 mm×40 mm on the substrate). On the reticle, the primary stripes would measure (assuming a ¼ demagnification factor, 100–$\mu$m strut width, and 50–$\mu$m skirt width) 192 mm×24 mm. As discussed above, the five primary stripes 11–15 define the primary features of the pattern. ("Primary" features include features that do not require complementary splitting and first portions of features that do require complementary splitting.) In a DRAM pattern, the exposure units that require complementary splitting are usually exposure units that define contacts and gates (located in peripheral circuits of memory chips), not the exposure units defining actual memory cells. As a result, only about 10% of the scanning strips are divided. The secondary scanning strips for these few divided scanning strips easily can be accommodated in the relatively small secondary stripes 11c–15c.

When transfer-exposing the primary stripes 11–15, the velocity of the reticle stage relative to the velocity of the substrate stage is expressed as the ratio (M+α):1, wherein 1/M is the demagnification factor and α is a rational number representing the proportion of nonpatterned regions of the reticle, such as struts, skirts, etc. On the other hand, when transfer exposing the secondary stripes 11c–15c, the reticle stage is moved at its maximum velocity. The substrate stage is moved at a velocity $V_W = V_M \cdot L_W/L_i$, wherein $V_M$ is the maximum velocity of the reticle stage, $L_W$ is the length of the respective stripe on the substrate, and $L_i$ is the length of the $i^{th}$ stripe defining the features on the reticle to be transferred.

Since continuously scanning the reticle stage has substantially no bearing on improving the throughput if $L_i$ is less than 5 mm, transfer is performed by a step-and-repeat operation of the reticle stage.

Figure 2A:
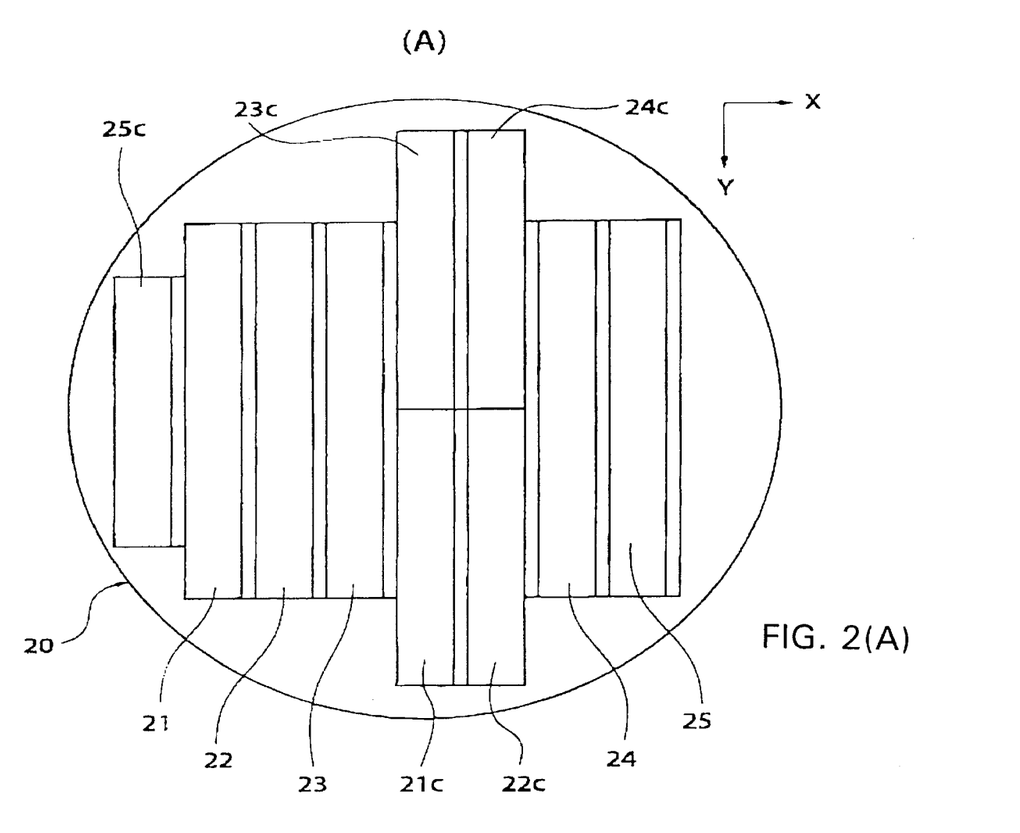
FIG. 2(A) is a plan view of a pattern as arrayed on a reticle for use in a pattern-transfer method according to a second example embodiment of the invention.
Figure 2B:
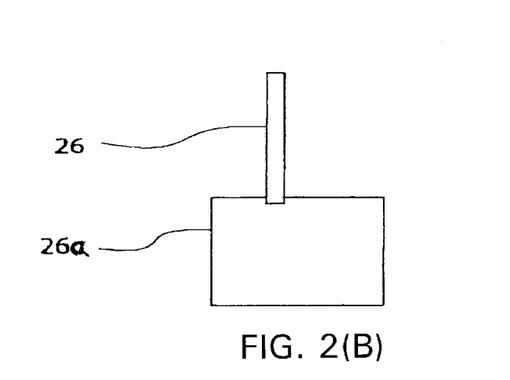
FIG. 2(B) is a schematic plan view of an example individual gate feature as defined on a reticle.

A second example embodiment is described below in connection with FIGS. 2(A) and 2(B). A plan view of the overall layout of stripes of a reticle pattern on a reticle is shown in FIG. 2(A). In this example embodiment, "large" features and "small" features are split into complimentary features and transferred separately. As used herein, "large" features are features each having a line width of at least two times the critical dimension of the respective pattern, and "small" features are features having a line width of less than two times the critical dimension of the respective pattern. The "critical dimension" is the smallest line width of the pattern.

In the reticle of FIG. 2(A), five primary stripes 21–25 are provided on a 12-inch diameter silicon wafer 20. Each primary stripe 21–25 defines a respective assemblage of "small" features. The FIG. 2(A) reticle also provides five secondary stripes 21c–25c each defining a respective assemblage of "large" features. Among the secondary stripes 21c–25c, one such stripe 25c is situated adjacent the left edge of the wafer 20. The remaining secondary stripes 21c–24c are situated in a Y-direction "stacked" configuration in the center of the wafer 20.

The reticle of FIG. 2(A) can be used to define, for example, a gate layer of a microprocessor chip. The constituent features of such a pattern typically include thin, linear features (e.g., 0.1 μm wide), represented by the element 26 in FIG. 2(B). Thin, linear features 26 require very close line width tolerances (e.g., ±10 nm). Pattern features having larger dimensions, such as the feature denoted by the element 26a in FIG. 2(B), have relatively relaxed tolerances. Features such as 26 and 26a in FIG. 2(B) normally do not need to be divided into complementary portions, even with a stencil reticle. However, if the reticle is intended for use with a charged particle beam as the energy beam, then such features are desirably divided. This is because beam current increases when used to transfer an entire feature in one shot. The increased beam current can cause beam defocusing and blurring due to space-charge effects. To minimize space-charge effects, the exposure unit defining the features 26, 26a is divided into complementary exposure units that are transferred in two separate shots. Each shot can be at a different dose to compensate as required for the resist-heating effect.

Most of the exposure units of the FIG. 2(A) embodiment have respective complementary exposure units. The "primary" exposure units are arrayed in the primary stripes 21–25, and the "secondary" exposure units are arranged in the secondary stripes 21c–25c. In this example, each of the primary stripes 21–25 has a length (in the Y direction) of 96 mm on the reticle, and each of the secondary stripes 21c–25c has a length (in the Y direction) of less than 70 mm. These dimensions allow all the stripes 21–25 and 21c–25c to be accommodated on a single 12-inch diameter wafer.

The primary stripes 21–25 are desirably transferred with the ratio of the reticle-stage velocity to the substrate-stage velocity being (M+α):1. The secondary stripes 21c–25c are desirably transferred with the reticle stage being moved at its maximum velocity $V_M$ and with the substrate stage being moved at a velocity $V_W = V_M \cdot 96/(70.4)$.

The FIG. 2(A) embodiment permits high-precision pattern transfer while minimizing beam defocusing due to space-charge effects. In addition, the FIG. 2(A) embodiment minimizes decreases in throughput arising from having to divide features into complimentary features.

Reticles and methods according to the invention are also effective in providing pattern transfer of very large chips (e.g., 16-gigabit DRAM), including chips having a pattern that can be defined on a single 12-inch-diameter silicon wafer, including complimentary features.

Figure 5:
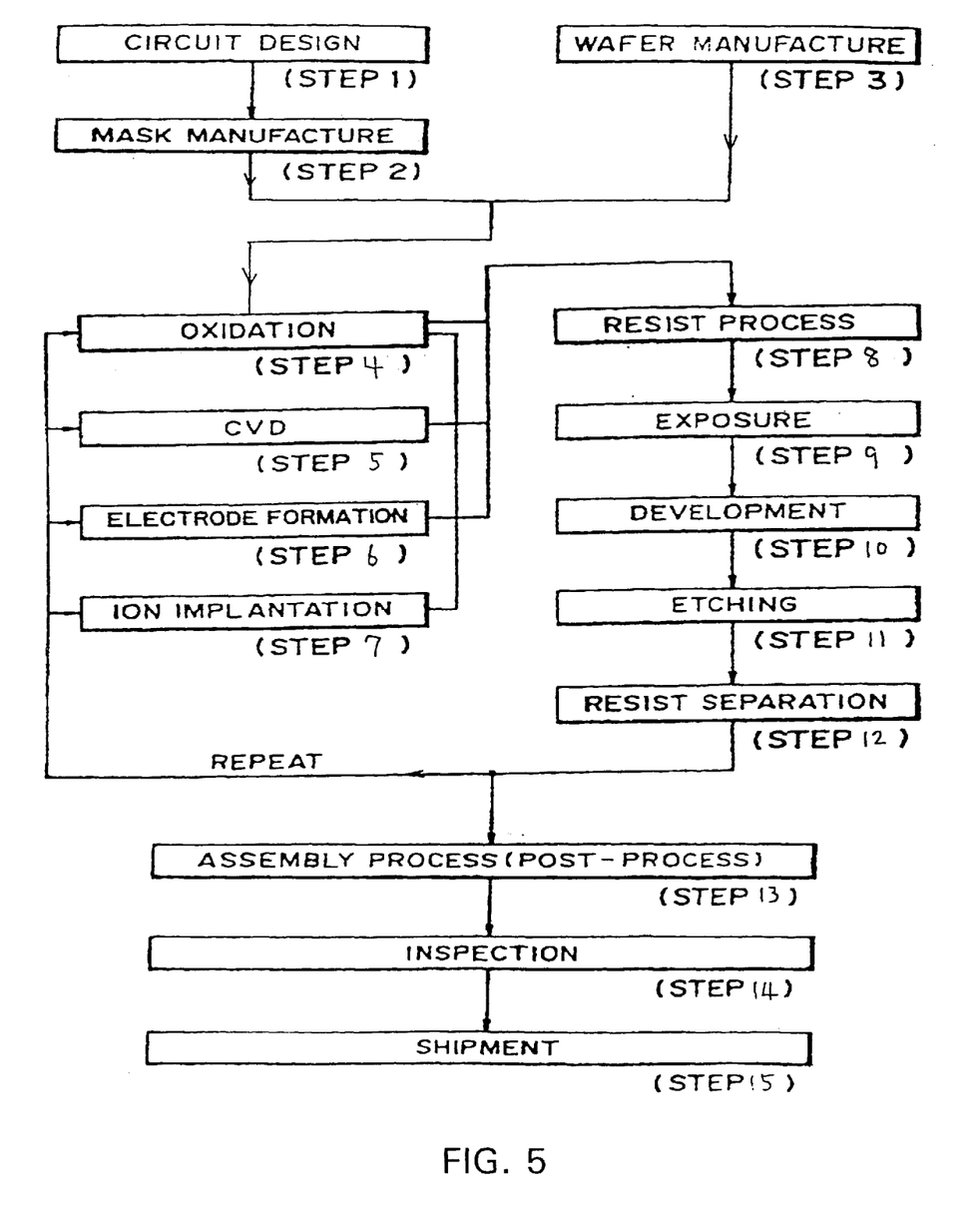
FIG. 5 is a flow chart for a representative device-manufacturing process utilizing a pattern-transfer method according to the invention.

FIG. 5 is a flow chart of steps in a process for manufacturing a semiconductor device such as a semiconductor chip (e.g., an integrated circuit or LSI device), a display panel (e.g., a liquid-crystal panel), or CCD, for example. In step 1, the circuit for the device is designed. In step 2, a reticle ("mask") for the circuit is manufactured. In step 3, a wafer is manufactured from a material such as silicon.

Steps 4–12 are directed to wafer-processing steps, specifically "pre-process" steps. In the pre-process steps, the circuit pattern defined on the reticle is transferred onto the wafer by microlithography. Step 13 is an assembly step (also termed a "post-process" step) in which the wafer that has passed through steps 4–12 is formed into semiconductor chips, display units, or the like. This step can include, e.g., assembling the devices (dicing and bonding) and packaging (e.g., encapsulation of individual chips). Step 14 is an inspection step in which any of various operability and qualification tests of the devices produced in step 13 are conducted. Afterward, devices that successfully pass step 14 are finished, packaged, and shipped (step 15).

Steps 4–12 also provide details of wafer processing. Step 4 is an oxidation step for oxidizing the surface of a wafer. Step 5 involves chemical vapor deposition (CVD) or other suitable technique for forming an insulating film on the wafer surface. Step 6 is an electrode-forming step for forming electrodes on the wafer (typically by vapor deposition).

Step 7 is an ion-implantation step for implanting ions (e.g., dopant ions) into the wafer. Step 8 involves application of a resist (exposure-sensitive material) to the wafer. Step 9 involves microlithographically exposing the resist so as to imprint the resist with the reticle pattern, as described elsewhere herein. Step 10 involves developing the exposed resist on the wafer. Step 11 involves etching the wafer to remove material from areas where developed resist is absent. Step 12 involves resist separation, in which remaining resist on the wafer is removed after the etching step. By repeating steps 4–12 as required, circuit patterns as defined by successive reticles are superposedly formed on the wafer.

Whereas the invention has been described in connection with multiple example embodiments, it will be apparent that the invention is not limited to those embodiments. On the contrary, the invention is intended to encompass all modifications, alternatives, and equivalents as may be included within the spirit and scope of the invention, as defined by the appended claims.

What is claimed is:

1. In a method for transferring a pattern, defined by multiple pattern portions on a segmented reticle, onto a substrate using an energy beam, the reticle being mounted on a movable reticle stage and the substrate being mounted on a movable substrate stage, an improvement comprising, during transfer-exposure of the pattern portions from the reticle to the substrate, moving the reticle stage and substrate stage at respective movement velocities, wherein a ratio of the movement velocities changes during the transfer-exposure.

2. In a method for transferring a pattern, defined by a segmented reticle, onto a substrate using an energy beam and a projection-optical system, the reticle being mounted on a movable reticle stage and the substrate being mounted on a movable substrate stage, an improvement comprising:
   (a) dividing the pattern into multiple pattern portions individually definable on the reticle;
   (b) categorizing the pattern portions as individually being of a first group or of a second group, the first group consisting of pattern portions requiring division into primary and secondary pattern portions wherein each secondary pattern portion is complementary to a corresponding primary pattern portion, and the second group consisting of pattern portions not requiring division into primary and secondary pattern portions;
   (c) forming on a reticle a first region containing the pattern portions of the second group and the primary pattern portions of the first group and a second region containing the secondary pattern portions of the first group;
   (d) transferring the pattern portions in the first region while moving the reticle stage at a velocity ratio of $(M+\alpha):1$ relative to a movement velocity of the substrate stage, wherein $1/M$ is a demagnification ratio of the projection-optical system and $\alpha$ is a rational number denoting a proportion of the reticle occupied by non-patterned areas; and
   (e) transferring the pattern portions in the second region while either moving the substrate stage at a velocity greater than the velocity defined in step (d) or moving the reticle stage in a step-and-repeat manner.

3. The method of claim 2, wherein the pattern portions are scanning strips, the first region is a primary stripe containing multiple scanning strips, and the second region is a secondary stripe containing at least one scanning strip.

4. In a method for transferring a pattern, defined by a segmented reticle, onto a substrate using an energy beam and a projection-optical system, the reticle being mounted on a movable reticle stage and the substrate being mounted on a movable substrate stage, an improvement comprising:
   (a) dividing the pattern into multiple stripes and scanning strips, wherein a scanning strip is a portion of a stripe;
   (b) for each scanning strip, if a particular scanning strip contains one or more pattern features requiring splitting into primary features and corresponding secondary features, then splitting the respective scanning strip into a primary scanning strip and a secondary scanning strip, the primary scanning strip containing the primary features and the secondary scanning strip containing the secondary features;
   (c) for each scanning strip, if a particular scanning strip contains only primary features, then regarding that scanning strip as a primary scanning strip;
   (d) for all scanning strips of the reticle pattern, grouping the primary scanning strips into primary stripes and the secondary scanning strips into secondary stripes;
   (e) transferring the scanning strips in the primary stripes while moving the reticle stage at a velocity ratio of $(M+\alpha):1$ relative to a movement velocity of the substrate stage, wherein $1/M$ is a demagnification ratio of the projection-optical system and $\alpha$ is a rational number denoting a proportion of the reticle occupied by non-patterned areas; and
   (f) transferring the scanning strips in the secondary stripes while either moving the substrate stage at a velocity greater than the velocity defined in step (e) or moving the reticle stage in a step-and-repeat manner.

5. The method of claim 4, further comprising the step of dividing each scanning strip into multiple exposure units.

6. The method of claim 5, wherein the exposure units in each scanning strip are exposed by the energy beam in a scanning manner.

7. The method of claim 5, wherein the exposure units in each scanning strip are exposed by the energy beam in a step-and-repeat manner.

8. In a method for transferring a pattern, defined by a segmented reticle and having a critical dimension, onto a substrate using an energy beam and a projection-optical system, the reticle being mounted on a movable reticle stage and the substrate being mounted on a movable substrate stage, an improvement comprising:
   (a) categorizing the features of the pattern into large features, having linewidths of at least twice the critical dimension, and small features having linewidths of less than twice the critical dimension;
   (b) grouping the small features into primary stripes and grouping the large features into secondary stripes; and
   (c) transferring the features in the primary stripes at a lower dose than the features in the secondary stripes.

9. The method of claim 8, wherein the features in each of the primary stripes and the secondary stripes are grouped into exposure units, wherein each stripe contains multiple exposure units.

10. The method of claim 9, wherein each exposure unit is exposed in a scanning manner.

11. The method of claim 9, wherein each exposure unit is exposed in a step-and-repeat manner.

12. A method for manufacturing a micro-patterned device, comprising the steps of:
   (a) providing a device pattern comprising pattern features and having a critical dimension;
   (b) categorizing the pattern features into large features, having minimum linewidths of at least twice the critical dimension, and small features having minimum linewidths of less than twice the critical dimension;
   (c) grouping the small features into primary stripes and the large features into secondary stripes;
   (d) using an energy beam, transferring the features in the primary stripes to a resist-coated substrate, the features in the primary stripes being transferred at a lower dose than used for transferring the features in the secondary stripes
   (e) developing the exposed resist;
   (f) etching the substrate; and
   (g) separating remaining resist from the substrate.

13. A method for manufacturing a micro-patterned device, comprising the steps:
(a) defining a device pattern with multiple pattern portions on a segmented reticle;
(b) mounting the reticle on a movable reticle stage and mounting a resist-coated substrate on a movable substrate stage;
(c) using an energy beam, transfer-exposing the pattern portions from the reticle to the resist-coated substrate using an energy beam while moving the reticle stage and the substrate stage at respective movement velocities, wherein a ratio of the movement velocities changes during the transfer-exposure;
(d) developing the exposed resist;
(e) etching the substrate; and
(f) separating remaining resist from the substrate.

14. A method for manufacturing a micro-patterned device, comprising the steps:
(a) dividing a device pattern into multiple pattern portions each individually definable on a segmented reticle;
(b) categorizing the pattern portions as individually being of a first group or of a second group, the first group consisting of pattern portions requiring division into primary and secondary pattern portions wherein each secondary pattern portion is complementary to a corresponding primary pattern portion, and the second group consisting of pattern portions not requiring division into primary and secondary pattern portions;
(c) forming on a reticle a first region containing the pattern portions of the second group and the primary pattern portions of the first group and a second region containing the secondary pattern portions of the first group;
(d) mounting the reticle on a movable reticle stage and a resist-coated substrate on a movable substrate stage:
(e) using an energy beam and a projection-optical system, (i) transferring the pattern portions in the first region to the resist-coated substrate while moving the reticle stage at a velocity ratio of $(M+\alpha):1$ relative to a movement velocity of the substrate stage, wherein $1/M$ is a demagnification ratio of the projection-optical system and $\alpha$ is a rational number denoting a proportion of the reticle occupied by non-patterned areas; and (ii) transferring the pattern portions in the second region to the resist-coated substrate while either moving the substrate stage at a velocity greater than the velocity defined in (i) or moving the reticle stage in a step-and-repeat manner;
(f) developing the exposed resist;
(g) etching the substrate; and
(h) separating remaining resist from the substrate.

15. A method for manufacturing a micro-patterned device, comprising the steps:
(a) dividing a device pattern into multiple stripes and scanning strips each individually definable on a segmented reticle, wherein a scanning strip is a portion of a stripe;
(b) for each scanning strip, if a particular scanning strip contains one or more pattern features requiring splitting into primary features and corresponding secondary features, then splitting the respective scanning strip into a primary scanning strip and a secondary scanning strip, the primary scanning strip containing the primary features and the secondary scanning strip containing the secondary features;
(c) for each scanning strip, if a particular scanning strip contains only primary features, then regarding that scanning strip as a primary scanning strip;
(d) for all scanning strips of the reticle pattern, defining the pattern on the reticle by grouping the primary scanning strips into primary stripes and the secondary scanning strips into secondary stripes on the reticle;
(e) mounting the reticle on a movable reticle stage and a substrate on a movable substrate stage:
(f) using an energy beam and a projection-optical system, (i) transferring the scanning strips in the primary stripes to a substrate while moving the reticle stage at a velocity ratio of $(M+\alpha):1$ relative to a movement velocity of the substrate stage, wherein $1/M$ is a demagnification ratio of the projection-optical system and $\alpha$ is a rational number denoting a proportion of the reticle occupied by non-patterned areas; and (ii) transferring the scanning strips in the secondary stripes while either moving the substrate stage at a velocity greater than the velocity defined in (i) or moving the reticle stage in a step-and-repeat manner;
(g) developing the exposed resist;
(h) etching the substrate; and
(i) separating remaining resist from the substrate.

16. A micro-patterned device produced by the method of claim 12.

17. A micro-patterned device produced by the method of claim 13.

18. A micro-patterned device produced by the method of claim 14.

19. A micro-patterned device produced by the method of claim 15.

* * * * *

UNITED STATES PATENT AND TRADEMARK OFFICE
CERTIFICATE OF CORRECTION

PATENT NO.     : 6,300,023 B1
DATED          : October 9, 2001
INVENTOR(S)    : Nakasuji

It is certified that error appears in the above-identified patent and that said Letters Patent is hereby corrected as shown below:

<u>Column 1,</u>
Line 42, "transferexposure" should read -- transfer-exposure --

<u>Column 9,</u>
Line 13, "transfer exposure" should read -- transfer-exposure --

Signed and Sealed this

Fourteenth Day of October, 2003

JAMES E. ROGAN
*Director of the United States Patent and Trademark Office*